United States Patent
Cui et al.

(10) Patent No.: US 11,736,865 B2
(45) Date of Patent: Aug. 22, 2023

(54) TRANSDUCER, METHOD OF MANUFACTURING TRANSDUCER, AND TRANSDUCING DEVICE

(71) Applicant: BOE TECHNOLOGY GROUP CO., LTD., Beijing (CN)

(72) Inventors: Zhao Cui, Beijing (CN); Feng Zhang, Beijing (CN); Wenqu Liu, Beijing (CN); Liwen Dong, Beijing (CN); Zhijun Lv, Beijing (CN); Xiaoxin Song, Beijing (CN); Detian Meng, Beijing (CN); Libo Wang, Beijing (CN); Qi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 161 days.

(21) Appl. No.: 17/288,947

(22) PCT Filed: May 29, 2020

(86) PCT No.: PCT/CN2020/093391
§ 371 (c)(1),
(2) Date: Apr. 27, 2021

(87) PCT Pub. No.: WO2020/253501
PCT Pub. Date: Dec. 24, 2020

(65) Prior Publication Data
US 2021/0385583 A1  Dec. 9, 2021

(30) Foreign Application Priority Data
Jun. 21, 2019 (CN) .......................... 201910541885.9

(51) Int. Cl.
*H04R 17/02* (2006.01)
*H04R 3/00* (2006.01)
(Continued)

(52) U.S. Cl.
CPC .............. *H04R 17/005* (2013.01); *H04R 3/00* (2013.01); *H04R 31/006* (2013.01);
(Continued)

(58) Field of Classification Search
CPC ................................ H04R 3/00; H04R 17/02
(Continued)

(56) References Cited

U.S. PATENT DOCUMENTS 7,042,136 B2  5/2006  Kita et al.
8,058,083 B2  11/2011  Eguchi et al.
(Continued)

FOREIGN PATENT DOCUMENTS

CN  1388731 A  1/2003
CN  1405905 A  3/2003
(Continued)

*Primary Examiner* — George C Monikang
(74) *Attorney, Agent, or Firm* — Chiwin Law LLC

(57) ABSTRACT

A transducer, a method of manufacturing a transducer, and a transducing device are provided. The transducer includes a receiving unit and a transmitting unit. The receiving unit includes a first receiving electrode, a first piezoelectric film, and a second receiving electrode which are sequentially stacked, and the receiving unit is configured to convert a first acoustic wave signal into an electrical signal by using a piezoelectric effect of the first piezoelectric film. The transmitting unit is configured to receive a control signal, which is based on the electrical signal, to transmit a second acoustic wave signal.

16 Claims, 5 Drawing Sheets

(51) Int. Cl.
*H04R 19/02* (2006.01)
*H04R 17/00* (2006.01)
*H04R 31/00* (2006.01)
*H10N 30/857* (2023.01)
*H10N 30/87* (2023.01)

(52) U.S. Cl.
CPC ......... *H10N 30/857* (2023.02); *H10N 30/872* (2023.02); *H04R 2430/00* (2013.01)

(58) Field of Classification Search
USPC ........................................ 381/111, 114, 116
See application file for complete search history.

(56) References Cited

U.S. PATENT DOCUMENTS

| | | |
|---|---|---|
| 8,288,856 B2 | 10/2012 | Yamaguchi et al. |
| 2010/0080409 A1 | 4/2010 | Xu et al. |
| 2018/0129849 A1* | 5/2018 | Strohmann ........ G06V 40/1394 |
| 2019/0141456 A1* | 5/2019 | Dogiamis ............. B06B 1/0625 |
| 2020/0171540 A1 | 6/2020 | Han et al. |

FOREIGN PATENT DOCUMENTS

| | | | |
|---|---|---|---|
| CN | 101740495 A | 6/2010 |
| CN | 102169850 A | 8/2011 |
| CN | 102404664 A | 4/2012 |
| CN | 205795719 U | 12/2016 |
| CN | 109068245 A | 12/2018 |
| CN | 109643378 A | 4/2019 |
| CN | 110234056 A | 9/2019 |

\* cited by examiner

TRANSDUCER, METHOD OF MANUFACTURING TRANSDUCER, AND TRANSDUCING DEVICE

This application is a U.S. National Phase Entry of International Application No. PCT/CN2020/093391, filed on May 29, 2020, designating the United States of America and claiming priority to Chinese Patent Application No. 201910541885.9, filed on Jun. 21, 2019. The present application claims priority to and the benefit of the above-identified applications and the above-identified applications are incorporated by reference herein in their entirety.

TECHNICAL FIELD

Embodiments of the present disclosure relate to a transducer, a method of manufacturing a transducer, and a transducing device.

BACKGROUND

Transducers refer to devices which can convert electrical energy and acoustic energy into each other, and for example, the transducers can convert electrical signals into acoustic wave signals or convert the acoustic wave signals into the electrical signals. For example, the transducer can only have a transmitting function (i.e., converting the electrical energy into the acoustic energy) or only have a receiving function (i.e., converting the acoustic energy into the electrical energy). Common transducers include microphones, speakers, earphones, and the like. With the development of technology, the transducers are used more and more widely in echo sounder, Doppler log, and acoustic correlation log, and have broad application prospects.

SUMMARY

At least one embodiment of the present disclosure provides a transducer which comprises a receiving unit and a transmitting unit. The receiving unit comprises a first receiving electrode, a first piezoelectric film, and a second receiving electrode which are sequentially stacked, and the receiving unit is configured to convert a first acoustic wave signal into an electrical signal by using a piezoelectric effect of the first piezoelectric film. The transmitting unit is configured to receive a control signal, which is based on the electrical signal, to transmit a second acoustic wave signal.

For example, in the transducer provided by an embodiment of the present disclosure, the transmitting unit comprises a first transmitting electrode, a second piezoelectric film, and a second transmitting electrode which are sequentially stacked, and the transmitting unit is capable of converting the control signal into the second acoustic wave signal by using a piezoelectric effect of the second piezoelectric film.

For example, in the transducer provided by an embodiment of the present disclosure, the receiving unit further comprises a signal transmission circuit layer, the signal transmission circuit layer comprises a signal transmission circuit, the signal transmission circuit comprises a switching element, and the switching element comprises a control electrode, a first electrode, and a second electrode; and the first electrode of the switching element is electrically connected to the first receiving electrode, and the switching element is configured to transmit the electrical signal according to a switching signal received by the control electrode of the switching element.

For example, in the transducer provided by an embodiment of the present disclosure, the signal transmission circuit further comprises a signal tieline, and the signal tieline is electrically connected to the second electrode of the switching element.

For example, in the transducer provided by an embodiment of the present disclosure, the signal transmission circuit layer comprises a first circuit layer, a first insulating layer, and a second circuit layer; the switching element is in the first circuit layer, and the signal tieline is in the second circuit layer; and the first insulating layer is between the first circuit layer and the second circuit layer, and comprises a first via hole, and the signal tieline is electrically connected to the second electrode of the switching element through the first via hole in the first insulating layer.

For example, the transducer provided by an embodiment of the present disclosure further comprises: a signal processing circuit layer which comprises a signal processing circuit. The signal processing circuit is electrically connected to the receiving unit and the transmitting unit, respectively, and is configured to process the electrical signal received from the receiving unit, generate the control signal, and provide the control signal to the transmitting unit.

For example, in the transducer provided by an embodiment of the present disclosure, the signal processing circuit comprises a modulation circuit and an amplification circuit; the modulation circuit is configured to modulate the electrical signal with a carrier signal to obtain a modulated signal; and the amplification circuit is configured to amplify the modulated signal to obtain the control signal.

For example, in the transducer provided by an embodiment of the present disclosure, the signal processing circuit layer is a flexible printed circuit board.

For example, the transducer provided by an embodiment of the present disclosure further comprises: a second insulating layer between the signal processing circuit layer and the first transmitting electrode. The second insulating layer comprises a second via hole, and the first transmitting electrode and the signal processing circuit are electrically connected through the second via hole in the second insulating layer.

For example, the transducer provided by an embodiment of the present disclosure further comprises: an adhesive layer between the signal processing circuit layer and the receiving unit. The receiving unit and the signal processing circuit layer are adhered to each other through the adhesive layer.

For example, in the transducer provided by an embodiment of the present disclosure, the adhesive layer comprises a third via hole, and the signal transmission circuit and the signal processing circuit are electrically connected through the third via hole.

For example, in the transducer provided by an embodiment of the present disclosure, the first piezoelectric film and/or the second piezoelectric film is a polyvinylidene fluoride film.

For example, in the transducer provided by an embodiment of the present disclosure, the second acoustic wave signal is a directional acoustic wave signal.

At least one embodiment of the present disclosure further provides a transducer, which comprises a receiving unit and a transmitting unit. The receiving unit is configured to convert a first acoustic wave signal which is received into an electrical signal; and the transmitting unit comprises a first transmitting electrode, a piezoelectric film, and a second transmitting electrode which are sequentially stacked, and the transmitting unit is configured to receive a control signal based on the electrical signal, and transmit a second acoustic wave signal by using a piezoelectric effect of the piezoelectric film.

At least one embodiment of the present disclosure further provides a transducing device, which comprises a plurality of transducers provided by any one of the embodiments of the present disclosure. The plurality of transducers are arranged in an array.

At least one embodiment of the present disclosure further provides a method of manufacturing a transducer. The method comprises: providing a first substrate, in which a first peeling layer is formed on a surface of the first substrate; forming a receiving unit on the first peeling layer, in which the receiving unit comprises a first receiving electrode, a first piezoelectric film, and a second receiving electrode which are sequentially stacked, and a crystallization and electric field polarization processing is performed on the first piezoelectric film; peeling off the receiving unit from the first peeling layer; providing a second substrate, in which a second peeling layer is formed on a surface of the second substrate; forming a transmitting unit on the second peeling layer; peeling off the transmitting unit from the second peeling layer; and adhering the receiving unit, which is peeled off, and the transmitting unit, which is peeled off, to each other with an adhesive layer.

For example, in the method provided by an embodiment of the present disclosure, forming the transmitting unit on the second peeling layer comprises: sequentially forming a first transmitting electrode, a second piezoelectric film, and a second transmitting electrode on the second peeling layer. The crystallization and electric field polarization processing is performed on the second piezoelectric film.

For example, in the method provided by an embodiment of the present disclosure, before forming the transmitting unit on the second peeling layer, the method further comprises: forming a signal processing circuit layer on the second peeling layer. The transmitting unit is formed on the signal processing circuit layer, the signal processing circuit layer comprises a signal processing circuit, and the transmitting unit is electrically connected to the signal processing circuit.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
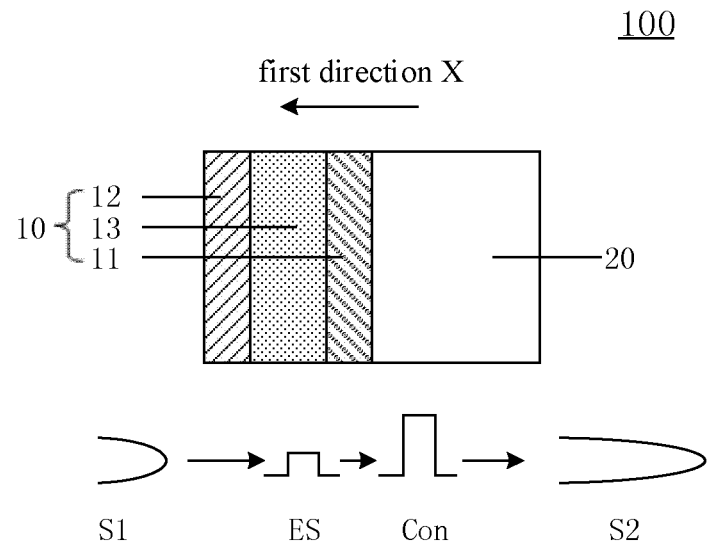
FIG. 1 is a schematic cross-sectional view of a transducer provided by some embodiments of the present disclosure.

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Speakers and microphones are common transducers. Traditional speakers and microphones need to form electromagnetic fields at work in order to realize the conversion between electrical energy and acoustic energy. In order to form the electromagnetic field, it is necessary to set up corresponding components in the speaker and the microphone, so that the speaker and the microphone are complex in structure, the production cost is high, the reliability is poor, and the accuracy of receiving or transmitting audio is poor. For example, the traditional speakers produce sounds by vibrating air molecules through loudspeakers, the transmitted sound waves are propagated in all directions, and the sound field is approximately distributed in a spherical field, so the directivity of sound wave propagation is poor, which is easy to cause the problems such as privacy leakage, noise pollution, and the like.

At least one embodiment of the present disclosure provides a transducer, a method of manufacturing a transducer, and a transducing device. The transducer does not need to form an electromagnetic field, has a simple structure and a small volume, and can receive or transmit audio more accurately. The transducer provided by at least some embodiments can also improve the directivity of transmitting audio.

Hereinafter, embodiments of the present disclosure will be described in detail with reference to the accompanying drawings. It should be noted that the same reference numerals in different drawings are used to refer to the same elements already described.

At least one embodiment of the present disclosure provides a transducer, which includes a receiving unit and a transmitting unit. The receiving unit includes a first receiving electrode, a first piezoelectric film, and a second receiving electrode which are sequentially stacked, and the receiving unit is configured to convert a first acoustic wave signal into an electrical signal by using a piezoelectric effect of the first piezoelectric film. The transmitting unit is configured to receive a control signal, which is based on the electrical signal, to transmit a second acoustic wave signal.

FIG. 1 is a schematic cross-sectional view of a transducer provided by some embodiments of the present disclosure. As illustrated in FIG. 1, a transducer 100 includes a receiving unit 10 and a transmitting unit 20.

For example, the receiving unit 10 includes a first receiving electrode 11, a first piezoelectric film 13, and a second receiving electrode 12 which are sequentially stacked. For example, as illustrated in FIG. 1, the first receiving electrode 11, the first piezoelectric film 13, and the second receiving electrode 12 are stacked along a first direction X to form, for example, a sandwich stacked structure.

The first receiving electrode 11 and the second receiving electrode 12 may be made of metal materials or transparent conductive materials. For example, in some examples, the first receiving electrode 11 is made of indium tin oxide (ITO), and the second receiving electrode 12 is made of molybdenum. It should be noted that, in the embodiments of the present disclosure, the material of the first receiving electrode 11 and the material of the second receiving electrode 12 are not limited to this case, and any suitable conductive materials can be used. The material of the first receiving electrode 11 and the material of the second receiving electrode 12 may be the same or different, which may be determined according to actual requirements, and the embodiments of the present disclosure are not limited to this case.

The first piezoelectric film 13 may be made of a piezoelectric material, for example, may be a polyvinylidene fluoride (PVDF) film. The first piezoelectric film 13 has a piezoelectric effect (or piezoelectric property). For example, in the case where a stress is applied to the first piezoelectric film 13, the surface of the first piezoelectric film 13 generates electric charges, and the amount of the electric charges is proportional to the stress. It should be noted that the piezoelectric effect is reversible, that is, the piezoelectric material can realize mutual conversion between the mechanical energy and the electrical energy. The piezoelectric effect includes a positive piezoelectric effect and an inverse piezoelectric effect. In the case where the piezoelectric material is deformed by an external force, both surfaces of the piezoelectric material generate electric charges with opposite polarities, which is called positive piezoelectric effect. On the contrary, in the case where an electric field is applied to the piezoelectric material, the piezoelectric material may undergo stretching out and drawing back vibration to lead to deformation, which is called inverse piezoelectric effect. In this embodiment, the first piezoelectric film 13 operates by using the positive piezoelectric effect. In the case where the first piezoelectric film 13 is the PVDF film, it is necessary to perform crystallization and electric field polarization processing on the PVDF film, so as to allow the PVDF film to have the piezoelectric property, that is, the first piezoelectric film 13 is a PVDF film after performing the crystallization and electric field polarization processing.

Compared with the common transducers, the embodiments of the present disclosure apply the piezoelectric film (such as the PVDF film) to the transducer 100 for the first time, and provide a transducer with a new structure and based on a new working principle. Because the piezoelectric film is formed in a simple way, the manufacturing process of the transducer 100 is simple, which is convenient for processing and manufacturing, and is low in production cost. In addition, the piezoelectric film has good flexibility and high piezoelectric strain constant, which improves the working performance of the transducer 100.

For example, the receiving unit 10 is configured to convert a first acoustic wave signal S1 into an electrical signal ES by using the piezoelectric effect of the first piezoelectric film 13. In the case where the first acoustic wave signal S1 propagates to the receiving unit 10, for example, through air, the air molecules near the receiving unit 10 may vibrate, thus applying a stress on the second receiving electrode 12 in the receiving unit 10, and the second receiving electrode 12 transmits the stress, thereby applying stress on the first piezoelectric film 13, which is deformed by the stress. Based on the piezoelectric effect (e.g., the positive piezoelectric effect), the first piezoelectric film 13 generates electric charges under the action of this stress, for example, the electric charges are generated on the surfaces of the first piezoelectric film 13 that are in contact with the first receiving electrode 11 and the second receiving electrode 12, respectively, and the polarities of the electric charges generated on the two surfaces are opposite. Therefore, a potential difference is generated between the first receiving electrode 11 and the second receiving electrode 12, thereby generating the electrical signal ES. For example, the electrical signal ES is a voltage signal, and the waveform of the electrical signal ES changes with the deformation degree of the first piezoelectric film 13, that is, changes with the change of the first acoustic wave signal S1. In the case where the volume of the first acoustic wave signal S1 is relatively large, the voltage value of the electrical signal ES is large, and in the case where the volume of the first acoustic wave signal S1 is relatively small, the voltage value of the electrical signal ES is small. It should be noted that the waveform of the electrical signal ES is not only related to the volume of the first acoustic wave signal S1, but also related to other parameters, such as the frequency of the first acoustic wave signal S1 and the like.

The transmitting unit 20 is configured to receive a control signal Con which is based on the electrical signal ES to transmit a second acoustic wave signal S2. For example, a separately provided signal processing circuit may be used to process the electrical signal ES, so as to generate the control signal Con and provide the control signal Con to the transmitting unit 20, and the transmitting unit 20 transmits the second acoustic wave signal S2 based on the control signal Con. For example, the signal processing circuit modulates and amplifies the electrical signal ES to obtain the control signal Con, which is convenient for the transmitting unit 20 to better realize the function of transmitting acoustic wave signals. For example, the signal processing circuit can be integrated inside the transducer 100 or arranged outside the transducer 100, and the embodiments of the present disclosure are not limited to this case.

For example, the second acoustic wave signal S2 may be basically the same as the first acoustic wave signal S1 (that is, the voice content and volume of the second acoustic wave signal S2 are basically the same as the voice content and volume of the first acoustic wave signal S1), or the volume of the second acoustic wave signal S2 may be larger than the volume of the first acoustic wave signal S1 (in this case, the voice content of the second acoustic wave signal S2 is still basically the same as the voice content of the first acoustic wave signal S1, that is, the voice information of the second acoustic wave signal S2 and the voice information of the first acoustic wave signal S1 are basically the same).

It should be noted that in the above embodiments of the present disclosure and their variants, the implementation of the transmitting unit 20 is not limited to this case, as long as the transmitting unit 20 can transmit the second acoustic wave signal S2 based on the control signal Con. For example, in some examples, the transmitting unit 20 may adopt a structure similar to the structure of the receiving unit 10, in this case, the transmitting unit 20 includes a piezoelectric film and works by adopting the inverse piezoelectric effect. The detailed description of the transmitting unit 20 can be referred to the following contents and is not described in detail here. For example, in some other examples, the transmitting unit 20 may adopt a common acoustic wave transmitting device, and in this case, the detailed description of the transmitting unit 20 may be referred to the conventional design and is not described in detail here.

In this way, the transducer 100 can receive the first acoustic wave signal S1 and transmit the second acoustic wave signal S2, so as to realize the transmission and/or amplification of the audio. The transducer 100 does not need to form the electromagnetic field, has a simple structure and a small volume, and can receive or transmit audio more accurately. For example, the transducer 100 can be applied to any devices that need to realize the transmission and/or amplification of the audio, such as a microphone, a speaker, a mobile multimedia device (e.g., a mobile phone), etc., and the embodiments of the present disclosure are not limited to this case.

Figure 2:
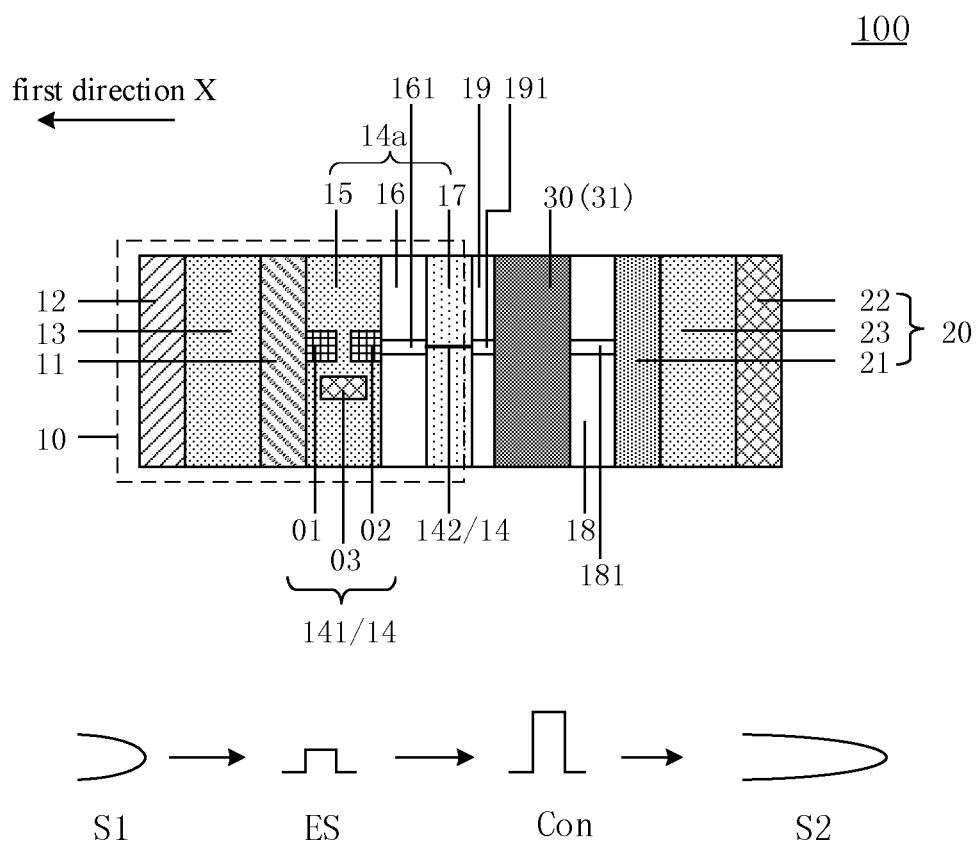
FIG. 2 is a schematic cross-sectional view of another transducer provided by some embodiments of the present disclosure.

FIG. 2 is a schematic cross-sectional view of another transducer provided by some embodiments of the present disclosure. As illustrated in FIG. 2, the transmitting unit 20 in the transducer 100 includes a first transmitting electrode 21, a second piezoelectric film 23, and a second transmitting electrode 22 which are sequentially stacked. For example, as illustrated in FIG. 2, the first transmitting electrode 21, the second piezoelectric film 23, and the second transmitting electrode 22 are stacked in a reverse direction of the first direction X, so as to form a sandwich stacked structure, for example.

The first transmitting electrode 21 and the second transmitting electrode 22 may be made of metal materials or transparent conductive materials. For example, in some examples, the first transmitting electrode 21 is made of indium tin oxide (ITO), and the second transmitting electrode 22 is made of molybdenum. It should be noted that, in the embodiments of the present disclosure, the material of the first transmitting electrode 21 and the material of the second transmitting electrode 22 are not limited to this case, and any suitable conductive materials can be used. The material of the first transmitting electrode 21 and the material of the second transmitting electrode 22 may be the same or different, which may be determined according to actual requirements, and the embodiments of the present disclosure are not limited to this case.

The second piezoelectric film 23 may be made of a piezoelectric material, for example, may be a PVDF film. The second piezoelectric film 23 may be made of the same or different piezoelectric materials as the first piezoelectric film 13. The second piezoelectric film 23 has a piezoelectric effect (or piezoelectric property). For example, in the case where an electric field is applied to the second piezoelectric film 23, the second piezoelectric film 23 may undergo stretching out and drawing back vibration, thereby resulting in deformation, and the degree of deformation is proportional to the intensity of the electric field. In this embodiment, the second piezoelectric film 23 operates by adopting the inverse piezoelectric effect. In the case where the second piezoelectric film 23 is a PVDF film, it is necessary to perform crystallization and electric field polarization processing on the PVDF film, so as to allow the PVDF film to have the piezoelectric property, so the second piezoelectric film 23 is a PVDF film after performing the crystallization and electric field polarization processing.

For example, the transmitting unit 20 converts the control signal Con into the second acoustic wave signal S2 by using the piezoelectric effect of the second piezoelectric film 23. In the case where the transmitting unit 20 receives the control signal Con (for example, a voltage signal), the control signal Con is applied to the first transmitting electrode 21 and the second transmitting electrode 22, so that an electric field is generated between the first transmitting electrode 21 and the second transmitting electrode 22, that is, the second piezoelectric film 23 is applied with an electric field. On the basis of the piezoelectric effect (e.g., the inverse piezoelectric effect), the second piezoelectric film 23 may undergo stretching out and drawing back vibration, thereby resulting in deformation, under the action of the electric field, so that the second transmitting electrode 22 stacked with the second piezoelectric film 23 may also undergo stretching out and drawing back vibration to result in deformation, thereby driving air molecules around the transmitting unit 20 to vibrate, so as to generate the second acoustic wave signal S2. For example, the deformation degree of the second piezoelectric film 23 changes with the waveform of the control signal Con, so the second acoustic wave signal S2 changes with the waveform of the control signal Con. In the case where the voltage value of the control signal Con is relatively large, the volume of the second acoustic wave signal S2 is large, and in the case where the voltage value of the control signal Con is relatively small, the volume of the second acoustic wave signal S2 is small. It should be noted that the waveform of the control signal Con can affect not only the volume of the second acoustic wave signal S2, but also other parameters, such as the frequency of the second acoustic wave signal S2 and the like.

For example, in this embodiment, the receiving unit 10 further includes a signal transmission circuit layer 14a, and the signal transmission circuit layer 14a includes a signal transmission circuit 14. The signal transmission circuit 14 includes a switching element 141, a signal tieline 142, and the like. The switching element 141 includes a first electrode 01, a second electrode 02, and a control electrode 03. The first electrode 01 of the switching element 141 is electrically connected to the first receiving electrode 11. The switching element 141 is configured to transmit the electrical signal ES according to a switching signal received by the control electrode 03 of the switching element 141. The signal tieline 142 is electrically connected to the second electrode 02 of the switching element 141, and is configured to transmit the electrical signal ES from the second electrode 02. For example, the signal tieline 142 may be an electrical wire or any suitable conductive structure. For example, in the case where the switching signal is at a valid level, the switching element 141 is turned on, thereby transmitting the electrical signal ES of the first receiving electrode 11 from the first electrode 01 to the second electrode 02, and then to the signal tieline 142. For example, the switching signal may be provided by a separately provided control circuit, and the control circuit is configured to control the working state of the transducer 100. For example, in the case where the switching signal is at a valid level, the switching element 141 is turned on, and the transducer 100 is in a working state; and in the case where the switching signal is at an invalid level, the switching element 141 is turned off and the transducer 100 stops working.

For example, the switching element 141 may be a thin film transistor, a field effect transistor or other devices with similar characteristics, and the embodiments of the present disclosure are not limited to this case. In the case where the switching element 141 is a thin film transistor, the first electrode 01 may be a source electrode or a drain electrode, the second electrode 02 may be a drain electrode or a source electrode, and the control electrode 03 may be a gate electrode, and the thin film transistor may be a top-gate-type, a bottom-gate-type or other suitable types.

For example, in this embodiment, the signal transmission circuit layer 14a includes a first circuit layer 15, a first insulating layer 16, and a second circuit layer 17. The switching element 141 is located in the first circuit layer 15, and the signal tieline 142 is located in the second circuit layer 17. The first insulating layer 16 is located between the first circuit layer 15 and the second circuit layer 17, and the first insulating layer 16 includes a first via hole 161. The signal tieline 142 is electrically connected to the second electrode 02 of the switching element 141 through the first via hole 161 in the first insulating layer 16. For example, the material of the first insulating layer 16 may be an organic insulating material or an inorganic insulating material, such as polyimide (PI), silicon nitride, silicon oxide or other suitable materials. The first circuit layer 15 and/or the second circuit layer 17 are, for example, flexible printed circuit boards. For example, the material of the first insulating layer 16 may be a viscous material, thereby adhering the first circuit layer 15 and the second circuit layer 17 together.

It should be noted that the structure and relative positions of the first electrode 01, the second electrode 02 and the control electrode 03 of the switching element 141 and the distribution mode of the switching element 141 in the first circuit layer 15 illustrated in FIG. 2 are only illustrative, but not restrictive, which can be determined according to actual application requirements and process conditions, and the embodiments of the present disclosure are not limited to this case. Similarly, the structure of the signal tieline 142 and the distribution mode of the signal tieline 142 in the second circuit layer 17 illustrated in FIG. 2 are only illustrative and not restrictive, which can be determined according to actual application requirements and process conditions, and the embodiments of the present disclosure are not limited to this case.

For example, in this embodiment, the transducer 100 further includes a signal processing circuit layer 30, and the signal processing circuit layer 30 is a flexible printed circuit board, for example. The signal processing circuit layer 30 includes a signal processing circuit 31. The signal processing circuit 31 is electrically connected to the receiving unit 10 and the transmitting unit 20, respectively, and is configured to process the electrical signal ES received from the receiving unit 10, generate the control signal Con, and provide the control signal Con to the transmitting unit 20. For example, in some examples, the signal processing circuit 31 is electrically connected to the signal tieline 142 and the first transmitting electrode 21, respectively, so as to receive the electrical signal ES transmitted through the signal tieline 142 and transmit the generated control signal Con to the first transmitting electrode 21.

Figure 3:
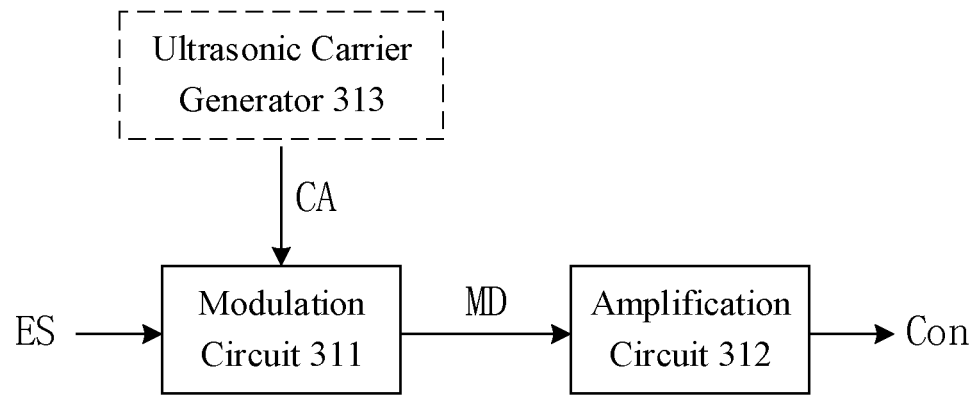
FIG. 3 is a schematic block diagram of a signal processing circuit of a transducer provided by some embodiments of the present disclosure.

For example, in some examples, as illustrated in FIG. 3, the signal processing circuit 31 includes a modulation circuit 311 and an amplification circuit 312. The modulation circuit 311 is electrically connected to the amplification circuit 312. The modulation circuit 311 is configured to modulate the electrical signal ES with a carrier signal CA to obtain a modulated signal MD. The amplification circuit 312 is configured to amplify the modulated signal MD to obtain the control signal Con.

For example, the carrier signal CA is provided by an ultrasonic carrier generator 313 provided separately, and the carrier signal CA is an ultrasonic carrier signal which is used for generating ultrasonic waves. After being processed, such as modulation and amplification, etc., the control signal Con can enable the transmitting unit 20 transmit directional acoustic wave signals (i.e., ultrasonic wave signals), that is, the second acoustic wave signal S2 is a directional acoustic wave signal. In this way, the audio signal can be modulated into the ultrasonic signal, so that the directivity of the transmitted audio can be improved. For example, because the transmitted acoustic wave signal is a directional acoustic wave signal, the transmitting unit 20 can generate a series of ends virtual sound sources distributed along the propagation axis, and control the sound to propagate in a narrow area, thus forming a highly directional audible sound source, while almost no sound can be heard in areas outside the sound field, thus providing users with a good privacy sound space.

For example, the modulation circuit 311 may adopt a common modulator or other suitable circuit structure, the amplification circuit 312 may adopt a common amplifier or other suitable circuit structure, and the embodiments of the present disclosure are not limited to this case. It should be noted that in the embodiments of the present disclosure, the signal processing circuit 31 is not limited to the structure and functions described above, and may include more circuit structures and have more functions. For example, in some examples, the signal processing circuit 31 may also include a filter circuit, an arithmetic circuit, etc., so as to have functions of filtering, arithmetic, etc., so that the control signal Con generated by the signal processing circuit 31 can meet diversified application requirements.

For example, in this embodiment, as illustrated in FIG. 2, the transducer 100 further includes a second insulating layer 18 located between the signal processing circuit layer 30 and the first transmitting electrode 21. For example, the second insulating layer 18 includes a second via hole 181, and the first transmitting electrode 21 and the signal processing circuit 31 (for example, an output terminal of the amplification circuit 312 in the signal processing circuit 31) are electrically connected through the second via hole 181 in the second insulating layer 18, so that the control signal Con output by the signal processing circuit 31 can be transmitted to the first transmitting electrode 21. For example, the material of the second insulating layer 18 may adopt an organic insulating material or an inorganic insulating material, such as polyimide (PI), silicon nitride, silicon oxide or other suitable materials. For example, the material of the second insulating layer 18 may be a material with viscosity, thereby adhering the signal processing circuit layer 30 and the first transmitting electrode 21 together.

For example, in this embodiment, the transducer 100 further includes an adhesive layer 19. The adhesive layer 19 is located between the signal processing circuit layer 30 and the receiving unit 10, and the receiving unit 10 and the signal processing circuit layer 30 are adhered to each other through the adhesive layer 19. For example, in some examples, the adhesive layer 19 is located between the second circuit layer 17 and the signal processing circuit layer 30, and the second circuit layer 17 and the signal processing circuit layer 30 are adhered with each other through the adhesive layer 19, thereby realizing the combination of the receiving unit 10 and the signal processing circuit layer 30. For example, the optical adhesive can be used as the material of the adhesive layer 19.

For example, the adhesive layer 19 includes a third via hole 191, and the signal transmission circuit 14 and the signal processing circuit 31 are electrically connected through the third via hole 191. For example, in some examples, the signal tieline 142 in the signal transmission circuit 14 is electrically connected to an input terminal of the modulation circuit 311 in the signal processing circuit 31 through the third via hole 191, thereby realizing the electrical connection between the signal transmission circuit 14 and the signal processing circuit 31.

The working principle of the transducer 100 is explained below with reference to FIG. 2.

In the case where the first acoustic wave signal S1 propagates to the receiving unit 10, for example, through air, the air molecules near the receiving unit 10 vibrate, thus applying a stress on the second receiving electrode 12 in the receiving unit 10. The second receiving electrode 12 transmits the stress, thereby applying the stress on the first piezoelectric film 13, which is deformed by the stress. The first piezoelectric film 13 generates electric charges according to the piezoelectric effect, and the first receiving electrode 11 generates the electrical signal ES. The switching element 141 is turned on under the action of the switching signal, and the electrical signal ES is transmitted to the second electrode 02 of the switching element 141 via the first electrode 01 of the switching element 141.

Then, the electrical signal ES is transmitted to the signal processing circuit 31 through the first via hole 161, the signal tieline 142 and the third via hole 191 in turn. The signal processing circuit 31 generates the control signal Con according to the electrical signal ES, and outputs the control signal Con. The control signal Con is transmitted to the first transmitting electrode 21 through the second via hole 181, and an electric field is generated between the first transmitting electrode 21 and the second transmitting electrode 22. Because of the piezoelectric effect, the second piezoelectric film 23 undergoes stretching out and drawing back vibration to result in deformation under the action of the electric field, so that the second transmitting electrode 22 stacked with the second piezoelectric film 23 also undergoes stretching out and drawing back vibration to result in deformation, thereby driving air molecules around the transmitting unit 20 to vibrate, so as to generate the second acoustic wave signal S2.

In this way, the transducer 100 can receive the first acoustic wave signal S1 and transmit the second acoustic wave signal S2, so as to realize audio transmission and/or amplification. The transducer 100 does not need to form an electromagnetic field, has a simple structure and a small volume, and can receive or transmit audio more accurately. In the case where the second acoustic wave signal S2 is a directional acoustic wave signal (e.g., ultrasonic signal), the directivity of the transmitted audio can be improved.

It should be noted that in the embodiments of the present disclosure, the second receiving electrode 12 is configured to be grounded or connected to other voltage terminals with preset voltage values, as long as a potential difference can be generated between the first receiving electrode 11 and the second receiving electrode 12 according to the piezoelectric effect of the first piezoelectric film 13, and the embodiments of the present disclosure are not limited to this case. Similarly, the second transmitting electrode 22 is configured to be grounded or connected to other voltage terminals with preset voltage values, as long as a potential difference can be generated between the first transmitting electrode 21 and the second transmitting electrode 22 in the case where the control signal Con is applied, and the embodiments of the present disclosure are not limited to this case.

At least one embodiment of the present disclosure also provides a transducer, and the transducer includes a receiving unit and a transmitting unit. The receiving unit is configured to convert a first acoustic wave signal, which is received, into an electrical signal. The transmitting unit includes a first transmitting electrode, a piezoelectric film, and a second transmitting electrode which are sequentially stacked. The transmitting unit is configured to receive a control signal based on the electrical signal and transmit a second acoustic wave signal by using a piezoelectric effect of the piezoelectric film. The transducer does not need to form an electromagnetic field, has a simple structure and a small volume, and can receive or transmit audio more accurately. The transducer provided by at least some embodiments can also improve the directivity of transmitting audio.

Figure 4:
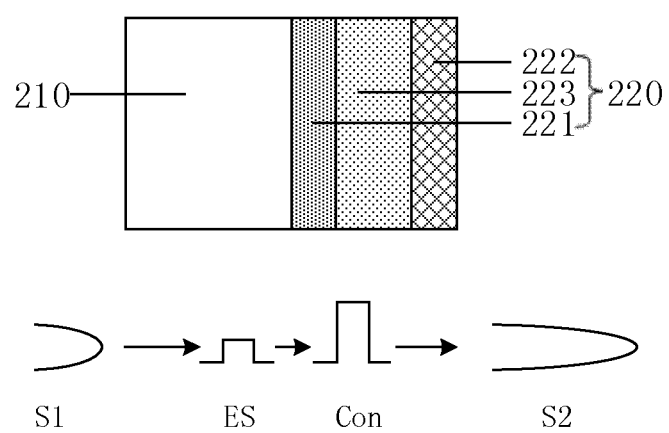
FIG. 4 is a schematic cross-sectional view of a transducer provided by some embodiments of the present disclosure.

FIG. 4 is a schematic cross-sectional view of a transducer provided by some embodiments of the present disclosure. As illustrated in FIG. 4, a transducer 200 includes a receiving unit 210 and a transmitting unit 220. The receiving unit 210 is configured to convert a first acoustic wave signal S1, which is received, into an electrical signal ES. The transmitting unit 220 includes a first transmitting electrode 221, a piezoelectric film 223, and a second transmitting electrode 222 which are sequentially stacked, and the transmitting unit 220 is configured to receive a control signal Con based on the electrical signal ES and transmit a second acoustic wave signal S2 by using a piezoelectric effect of the piezoelectric film 223. For example, the detailed description of the transmitting unit 220 can be referred to the above description of the transmitting unit 20, and the detail is not described herein again.

For example, the implementation of the receiving unit 210 is not limited, as long as the receiving unit 210 can convert the received first acoustic wave signal S1 into the electrical signal ES. For example, in some examples, the structure of the receiving unit 210 may be similar to the structure of the receiving unit 10 described above. In this case, the receiving unit 210 includes a piezoelectric film and works based on the piezoelectric effect. The detailed description of the receiving unit 210 can be referred to the above description of the receiving unit 10, and the detail is not repeated herein again. For example, in some other examples, the receiving unit 210 may adopt a common acoustic wave receiving device. In this case, the detailed description of the receiving unit 210 may be referred to the conventional design, and the detail is not described herein again.

At least one embodiment of the present disclosure also provides a transducing device, which includes a plurality of transducers according to any embodiment of the present disclosure, and the plurality of transducers are arranged in an array. The transducing device does not need to form an electromagnetic field, has a simple structure and a small volume, and can receive or transmit audio more accurately. The transducing device provided by at least some embodiments can also improve the directivity of transmitting audio.

Figure 5:
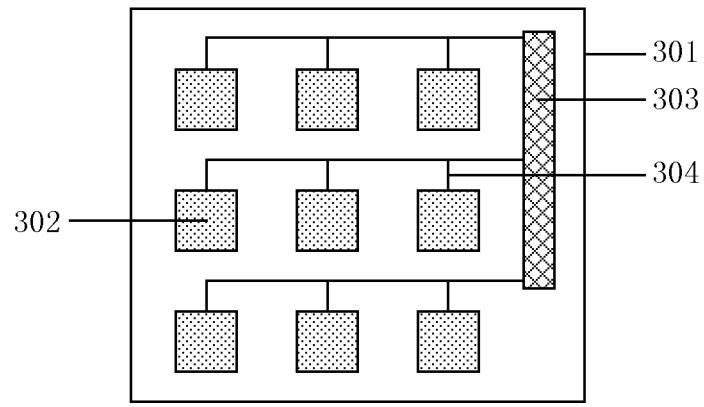
FIG. 5 is a schematic plan view of a transducing device provided by some embodiments of the present disclosure.

FIG. 5 is a schematic plan view of a transducing device provided by some embodiments of the present disclosure. As illustrated in FIG. 5, a transducing device 300 includes a base substrate 301 and a plurality of transducers 302, and the transducer 302 is the transducer provided in any embodiment of the present disclosure, such as the aforementioned transducer 100/200. For example, the transducer 302 is disposed on the base substrate 301. For example, the plurality of transducers 302 are arranged in an array, so that the first acoustic wave signal S1 can be received more accurately and clearly, and the second acoustic wave signal S2 can be transmitted accurately. It should be noted that the base substrate 301 is not limited to a planar form, but may also be a curved surface, and the arrangement of the plurality of transducers 302 is not limited to the situation illustrated in FIG. 5, and can be any suitable arrangement, and can be regular arrangement or irregular arrangement, which can be determined according to actual requirements. The shape of the transducer 302 in the cross section parallel to the base substrate 301 is not limited to square, but can also be any regular or irregular shape, such as rectangle, circle, trapezoid, etc., and the embodiments of the present disclosure are not limited to this case.

For example, in this embodiment, the transducing device 300 further includes a bonding pad 303 and a transmission line 304. The bonding pad 303 is used to electrically connect with circuits or components provided separately, and the transmission line 304 is used to electrically connect respective transducers 302 with the bonding pad 303. In this way, the transducer 302 can receive switching signals, carrier signals CA, grounding signals, etc., from separately provided circuits or components, thereby controlling the working state of the transducer 302. For example, in the case where the switching signal is at a valid level, the transducer 302 is in a working state, and in the case where the switching signal is at an invalid level, the transducer 302 is in a non-working state (i.e., stops working).

At least one embodiment of the present disclosure also provides a method of manufacturing a transducer, and the transducer described in any embodiment of the present disclosure can be manufactured by the method. The transducer manufactured by the method does not need to form an electromagnetic field, has a simple structure and a small volume, and can receive or transmit audio more accurately.

Figure 6:
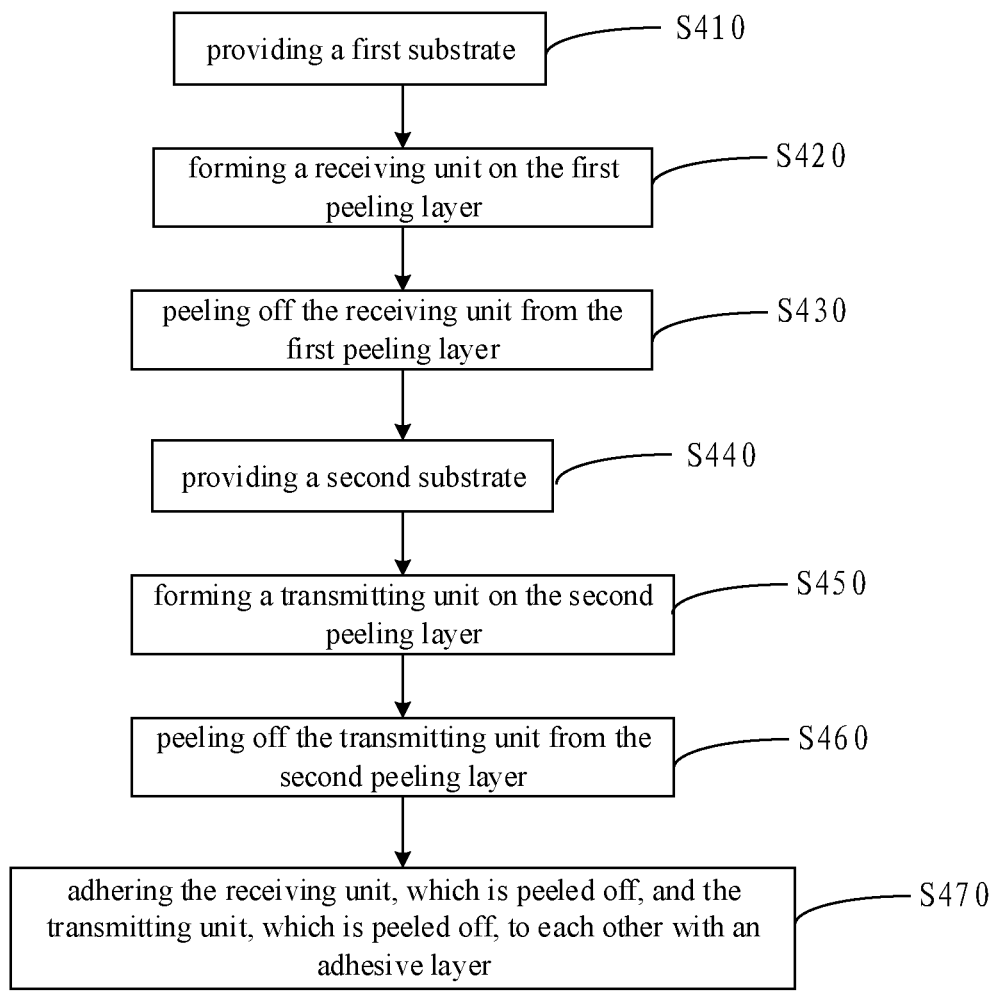
FIG. 6 is a schematic flow chart of a method of manufacturing a transducer provided by some embodiments of the present disclosure.

FIG. 6 is a schematic flow chart of a method of manufacturing a transducer provided by some embodiments of the present disclosure. For example, in some examples, as illustrated in FIG. 6, the method includes following operations.

S410: providing a first substrate, a first peeling layer being formed on a surface of the first substrate;

S420: forming a receiving unit on the first peeling layer, the receiving unit including a first receiving electrode, a first piezoelectric film and a second receiving electrode which are sequentially stacked, and a crystallization and electric field polarization processing being performed on the first piezoelectric film;

S430: peeling off the receiving unit from the first peeling layer;

S440: providing a second substrate, a second peeling layer being formed on a surface of the second substrate;

S450: forming a transmitting unit on the second peeling layer;

S460: peeling off the transmitting unit from the second peeling layer; and

S470: adhering the receiving unit, which is peeled off, and the transmitting unit, which is peeled off, to each other with an adhesive layer.

For example, in some examples, step S450 further includes: sequentially forming a first transmitting electrode, a second piezoelectric film and a second transmitting electrode on the second peeling layer. The crystallization and electric field polarization processing is performed on the second piezoelectric film.

For example, in some examples, before performing step S450, the method further includes: forming a signal processing circuit layer on the second peeling layer. For example, the transmitting unit is formed on the signal processing circuit layer, the signal processing circuit layer includes a signal processing circuit, and the transmitting unit is electrically connected to the signal processing circuit.

For example, the first piezoelectric film and/or the second piezoelectric film can be heated to a temperature of 140° C. and kept for 1 hour, so as to realize the crystallization processing on the first piezoelectric film and/or the second piezoelectric film. For example, when the crystallization processing is performed, the first piezoelectric film and/or the second piezoelectric film needs to be placed in an air atmosphere. Before performing the crystallization processing, the first piezoelectric film and/or the second piezoelectric film are semi-crystalline phase polymers, including α-crystal type, β-crystal type, γ-crystal type and the like. After performing the crystallization processing, a large amount of α-crystal type and γ-crystal type in the first piezoelectric film and/or the second piezoelectric film are transformed into the β-crystal type, so that the content of β-crystal type (e.g., the amount of molecules) reaches 60%~70%.

For example, a high voltage electric field can be applied to the first piezoelectric film and/or the second piezoelectric film, so as to realize the electric field polarization processing on the first piezoelectric film and/or the second piezoelectric film. Through the electric field polarization processing, the molecular dipole moments of the β-crystal type in the first piezoelectric film and/or the second piezoelectric film realize directional arrangement.

Through the above crystallization and electric field polarization processing, the first piezoelectric film and/or the second piezoelectric film has the piezoelectric effect (or piezoelectric property), so that the expected function can be realized.

Figure 7A:
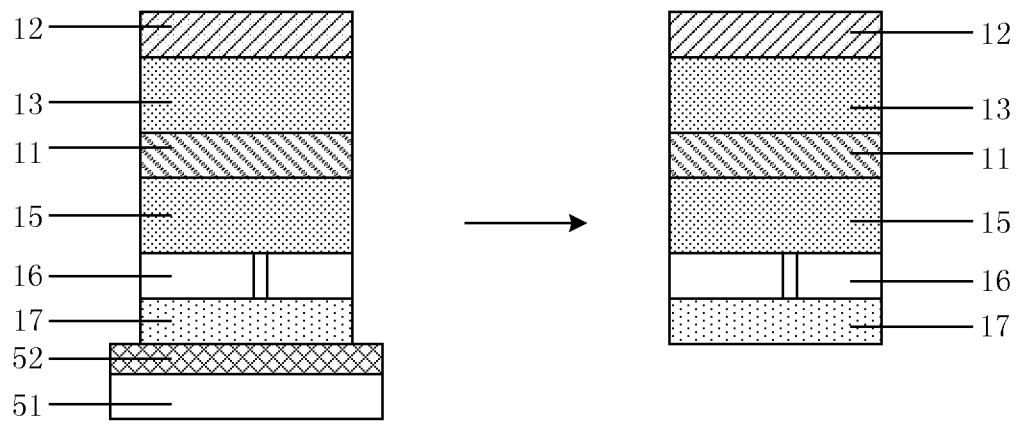
FIG. 7A is a first schematic cross-sectional view of a transducer in a manufacturing process provided by some embodiments of the present disclosure.
Figure 7B:
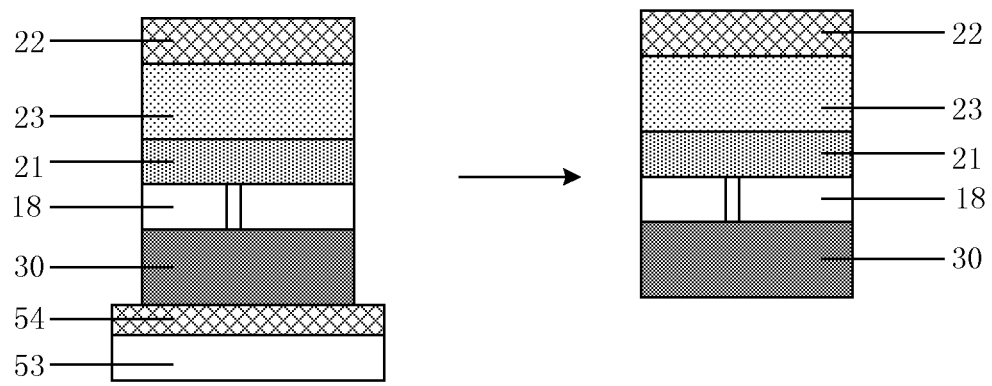
FIG. 7B is a second schematic cross-sectional view of a transducer in a manufacturing process provided by some embodiments of the present disclosure.
Figure 7C:
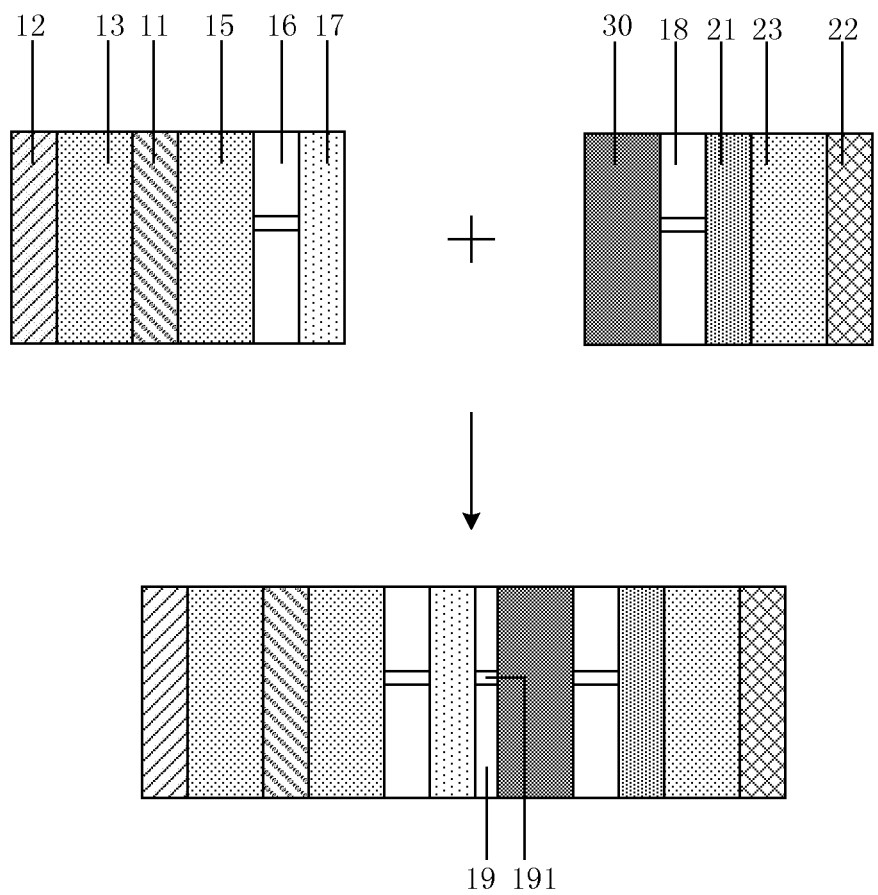
FIG. 7C is a third schematic cross-sectional view of a transducer in a manufacturing process provided by some embodiments of the present disclosure.

With reference to FIGS. 7A-7C, the method is exemplarily illustrated below, and the method is used to manufacture the transducer 100 illustrated in FIG. 2.

As illustrated in FIG. 7A, the receiving unit 10 is first formed.

For example, a first substrate 51 is provided, and a first peeling layer 52 is formed on a surface of the first substrate 51. The first substrate 51 is, for example, a glass substrate or a plastic substrate. The first peeling layer 52 is formed on the first substrate 51 by coating, for example, and the first peeling layer 52 may be an organic material, such as resin. For example, the first peeling layer 52 may be made of a commercially available Daimler material.

On the first peeling layer 52, the second circuit layer 17, the first insulating layer 16, the first circuit layer 15, the first receiving electrode 11, the first piezoelectric film 13 and the second receiving electrode 12 are sequentially formed to form the receiving unit 10. For example, the first circuit layer 15, the second circuit layer 17, the first receiving electrode 11 and the second receiving electrode 12 may be manufactured by a deposition process and a patterning process, and the first insulating layer 16 may be manufactured by a coating process and an etching process. For example, the first piezoelectric film 13 can be manufactured by a coating process (such as knife coating, spin coating, etc.), and is subjected to crystallization and electric field polarization processing, so that the first piezoelectric film 13 has a piezoelectric effect (or piezoelectric property).

The detailed description of each film layer in the receiving unit 10 can be referred to the foregoing contents, and the details are not repeated herein again. For the sake of brevity and clarity, the detailed structure of the components included in each film layer is not illustrated in FIG. 7A, for example, the switching element 141, the signal tieline 142, etc. are not illustrated in FIG. 7A. It should be understood that these components are formed in the corresponding film layer when the method is performed.

After each film layer of the receiving unit 10 is formed, the receiving unit 10 is peeled off from the first peeling layer 52 to obtain the receiving unit 10.

As illustrated in FIG. 7B, the signal processing circuit layer 30, the second insulating layer 18, and the transmitting unit 20 are then formed.

For example, a second substrate 53 is provided, and a second peeling layer 54 is formed on a surface of the second substrate 53. The second substrate 53 is, for example, a glass substrate or a plastic substrate. The second peeling layer 54 is formed on the second substrate 53 by coating, for example, and the second peeling layer 54 may be an organic material, such as resin. For example, the second peeling layer 54 may be made of a commercially available Daimler material.

On the second peeling layer 54, the signal processing circuit layer 30, the second insulating layer 18, the first transmitting electrode 21, the second piezoelectric film 23, and the second transmitting electrode 22 are sequentially formed, and the first transmitting electrode 21, the second piezoelectric film 23, and the second transmitting electrode 22 constitute the transmitting unit 20. For example, the signal processing circuit layer 30, the first transmitting electrode 21 and the second transmitting electrode 22 may be manufactured by a deposition process and a patterning process, and the second insulating layer 18 may be manufactured by a coating process and an etching process. For example, the second piezoelectric film 23 can be manufactured by a coating process (such as knife coating, spin coating, etc.), and is subjected to crystallization and electric field polarization processing, so that the second piezoelectric film 23 has a piezoelectric effect (or piezoelectric property).

The detailed description of the signal processing circuit layer 30, the second insulating layer 18 and each film layer in the transmitting unit 20 can be referred to the foregoing contents, and the repetition is not repeated herein again. For the sake of brevity and clarity, the detailed structure of components included in each film layer is not illustrated in FIG. 7B, for example, the specific circuit structure in the signal processing circuit layer 30 is not illustrated, and it should be understood that these components are formed in the corresponding film layer when the method is performed.

After forming the signal processing circuit layer 30, the second insulating layer 18 and each film layer of the transmitting unit 20, the composite structure including the signal processing circuit layer 30, the second insulating layer 18 and the transmitting unit 20 is peeled off from the second peeling layer 54, thereby obtaining the composite structure including the signal processing circuit layer 30, the second insulating layer 18 and the transmitting unit 20.

As illustrated in FIG. 7C, the receiving unit 10, which is peeled off, and the composite structure, which is peeled off, including the signal processing circuit layer 30, the second insulating layer 18, and the transmitting unit 20, are adhered to face each other with the adhesive layer 19, thereby forming the transducer 100.

For example, the optical adhesive can be used as the material of the adhesive layer 19. It should be noted that in the case where the adhesive layer 19 is used for adhering, it is necessary to provide a third via hole 191 in the adhesive layer 19, so as to electrically connect the signal processing circuit 31 in the signal processing circuit layer 30 with the signal tieline 142 in the second circuit layer 17 during adhering. For example, the third via hole 191 may also be filled with a conductive material to better electrically connect the signal processing circuit 31 and the signal tieline 142.

It should be noted that in the embodiments of the present disclosure, the method may include more or less steps, and the order of respective steps is not limited, which may be determined according to actual requirements. The technical effect and detailed description of the method can be referred to the description of the transducer 100/200 above, and the details are not repeated herein again.

The following statements should be noted.

(1) The accompanying drawings involve only the structure(s) in connection with the embodiment(s) of the present disclosure, and other structure(s) can be referred to common design(s).

(2) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A transducer, comprising a receiving unit and a transmitting unit,
   wherein the receiving unit comprises a first receiving electrode, a first piezoelectric film, and a second receiving electrode which are sequentially stacked, and the receiving unit is configured to convert a first acoustic wave signal into an electrical signal by using a piezoelectric effect of the first piezoelectric film; and
   the transmitting unit is configured to receive a control signal, which is based on the electrical signal, to transmit a second acoustic wave signal,
   wherein the transmitting unit comprises a first transmitting electrode, a second piezoelectric film, and a second transmitting electrode which are sequentially stacked, and
   the transmitting unit is capable of converting the control signal into the second acoustic wave signal by using a piezoelectric effect of the second piezoelectric film,
   wherein the receiving unit further comprises a signal transmission circuit layer, the signal transmission circuit layer comprises a signal transmission circuit, the signal transmission circuit comprises a switching element, and the switching element comprises a control electrode, a first electrode, and a second electrode; and
   the first electrode of the switching element is electrically connected to the first receiving electrode, and the switching element is configured to transmit the electrical signal according to a switching signal received by the control electrode of the switching element.

2. The transducer according to claim 1, wherein the signal transmission circuit further comprises a signal tieline, and the signal tieline is electrically connected to the second electrode of the switching element.

3. The transducer according to claim 2, wherein the signal transmission circuit layer comprises a first circuit layer, a first insulating layer, and a second circuit layer;
the switching element is in the first circuit layer, and the signal tieline is in the second circuit layer; and
the first insulating layer is between the first circuit layer and the second circuit layer, and comprises a first via hole, and the signal tieline is electrically connected to the second electrode of the switching element through the first via hole in the first insulating layer.

4. The transducer according to claim 1, further comprising:
a signal processing circuit layer which comprises a signal processing circuit,
wherein the signal processing circuit is electrically connected to the receiving unit and the transmitting unit, respectively, and is configured to process the electrical signal received from the receiving unit, generate the control signal, and provide the control signal to the transmitting unit.

5. The transducer according to claim 4, wherein the signal processing circuit comprises a modulation circuit and an amplification circuit;
the modulation circuit is configured to modulate the electrical signal with a carrier signal to obtain a modulated signal; and
the amplification circuit is configured to amplify the modulated signal to obtain the control signal.

6. The transducer according to claim 4, wherein the signal processing circuit layer is a flexible printed circuit board.

7. The transducer according to claim 4, further comprising:
a second insulating layer between the signal processing circuit layer and the first transmitting electrode,
wherein the second insulating layer comprises a second via hole, and
the first transmitting electrode and the signal processing circuit are electrically connected through the second via hole in the second insulating layer.

8. The transducer according to claim 4, further comprising:
an adhesive layer between the signal processing circuit layer and the receiving unit,
wherein the receiving unit and the signal processing circuit layer are adhered to each other through the adhesive layer.

9. The transducer according to claim 8, wherein the adhesive layer comprises a third via hole, and the signal transmission circuit and the signal processing circuit are electrically connected through the third via hole.

10. The transducer according to claim 1, wherein the first piezoelectric film and/or the second piezoelectric film is a polyvinylidene fluoride film.

11. The transducer according to claim 1, wherein the second acoustic wave signal is a directional acoustic wave signal.

12. The transducer according to claim 2, further comprising:
a signal processing circuit layer which comprises a signal processing circuit,
wherein the signal processing circuit is electrically connected to the receiving unit and the transmitting unit, respectively, and is configured to process the electrical signal received from the receiving unit, generate the control signal, and provide the control signal to the transmitting unit.

13. The transducer according to claim 3, further comprising:
a signal processing circuit layer which comprises a signal processing circuit,
wherein the signal processing circuit is electrically connected to the receiving unit and the transmitting unit, respectively, and is configured to process the electrical signal received from the receiving unit, generate the control signal, and provide the control signal to the transmitting unit.

14. A transducing device, comprising a plurality of transducers according to claim 1, wherein the plurality of transducers are arranged in an array.

15. A method of manufacturing a transducer, comprising:
providing a first substrate, wherein a first peeling layer is formed on a surface of the first substrate;
forming a receiving unit on the first peeling layer, wherein the receiving unit comprises a first receiving electrode, a first piezoelectric film, and a second receiving electrode which are sequentially stacked, and a crystallization and electric field polarization processing is performed on the first piezoelectric film;
peeling off the receiving unit from the first peeling layer;
providing a second substrate, wherein a second peeling layer is formed on a surface of the second substrate;
forming a transmitting unit on the second peeling layer;
peeling off the transmitting unit from the second peeling layer; and
adhering the receiving unit, which is peeled off, and the transmitting unit, which is peeled off, to each other with an adhesive layer,
wherein forming the transmitting unit on the second peeling layer comprises:
sequentially forming a first transmitting electrode, a second piezoelectric film, and a second transmitting electrode on the second peeling layer, wherein the crystallization and electric field polarization processing is performed on the second piezoelectric film,
wherein the receiving unit further comprises a signal transmission circuit layer, the signal transmission circuit layer comprises a signal transmission circuit, the signal transmission circuit comprises a switching element, and the switching element comprises a control electrode, a first electrode, and a second electrode; and
the first electrode of the switching element is electrically connected to the first receiving electrode, and the switching element is configured to transmit an electrical signal according to a switching signal received by the control electrode of the switching element.

16. The method according to claim 15, wherein before forming the transmitting unit on the second peeling layer, the method further comprises:
forming a signal processing circuit layer on the second peeling layer, wherein the transmitting unit is formed on the signal processing circuit layer, the signal processing circuit layer comprises a signal processing circuit, and the transmitting unit is electrically connected to the signal processing circuit.

* * * * *